United States Patent
Ito et al.

(10) Patent No.: US 10,749,414 B2
(45) Date of Patent: Aug. 18, 2020

(54) MOTOR DRIVING DEVICE AND AIR CONDITIONER

(71) Applicant: Mitsubishi Electric Corporation, Tokyo (JP)

(72) Inventors: Norikazu Ito, Tokyo (JP); Takuya Shimomugi, Tokyo (JP); Masahiro Fukuda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 25 days.

(21) Appl. No.: 16/072,529

(22) PCT Filed: Apr. 27, 2016

(86) PCT No.: PCT/JP2016/063291
§ 371 (c)(1),
(2) Date: Jul. 25, 2018

(87) PCT Pub. No.: WO2017/187578
PCT Pub. Date: Nov. 2, 2017

(65) Prior Publication Data
US 2019/0305649 A1    Oct. 3, 2019

(51) Int. Cl.
*H02K 11/25* (2016.01)
*H02K 11/33* (2016.01)
(Continued)

(52) U.S. Cl.
CPC .............. *H02K 11/33* (2016.01); *F24F 11/88* (2018.01); *H01L 25/0655* (2013.01);
(Continued)

(58) Field of Classification Search
CPC .......... H02K 9/22; H02K 11/33; H02K 11/28; H02P 27/08; H02M 7/003; F24F 1/20
(Continued)

(56) References Cited

U.S. PATENT DOCUMENTS

| 4,674,182 A * | 6/1987 | Igarashi | H05K 1/0281 29/830 |
| 2011/0036624 A1* | 2/2011 | Kagimura | H05K 1/0263 174/260 |

FOREIGN PATENT DOCUMENTS

| EP | 2 496 060 A1 | 9/2012 |
| JP | 2001-054286 A | 2/2001 |

(Continued)

OTHER PUBLICATIONS

English Translation WO2009130890 (2009) and JP2010060241A (2010) (Year: 2009, 2010).*
(Continued)

*Primary Examiner* — Jose A Gonzalez-Quinones
(74) *Attorney, Agent, or Firm* — Posz Law Group, PLC

(57) ABSTRACT

A motor driving device that converts alternating-current power to direct-current power and drives a motor, the motor driving device including a printed circuit board having a first plate surface and a second plate surface, having an inverter module and an inverter module provided on the first plate surface, having a first power pattern provided on the second plate surface and connected to the inverter module, having a second power pattern provided on the second plate surface and connected to the inverter module, and having a jumper portion to connect the first power pattern and the second power pattern. A cross-sectional area of the jumper portion is larger than a cross-sectional area of the first power pattern or the second power pattern.

20 Claims, 5 Drawing Sheets

(51) Int. Cl.
| | |
|---|---|
| H02K 9/22 | (2006.01) |
| H02K 1/27 | (2006.01) |
| H02M 5/458 | (2006.01) |
| H02P 27/08 | (2006.01) |
| H02P 27/06 | (2006.01) |
| F24F 11/88 | (2018.01) |
| H01L 25/065 | (2006.01) |
| H05K 1/02 | (2006.01) |
| H05K 1/18 | (2006.01) |
| H05K 7/20 | (2006.01) |
| H05K 7/14 | (2006.01) |
| H05K 3/22 | (2006.01) |
| H02K 7/14 | (2006.01) |
| H02K 17/32 | (2006.01) |
| F24F 1/20 | (2011.01) |
| H02M 7/5387 | (2007.01) |

(52) U.S. Cl.
CPC ............ *H02K 1/2773* (2013.01); *H02K 7/14* (2013.01); *H02K 9/22* (2013.01); *H02K 11/25* (2016.01); *H02M 5/458* (2013.01); *H02P 27/06* (2013.01); *H02P 27/08* (2013.01); *H05K 1/0204* (2013.01); *H05K 1/182* (2013.01); *H05K 3/222* (2013.01); *H05K 7/1432* (2013.01); *H05K 7/20909* (2013.01); *F24F 1/20* (2013.01); *H02K 2211/03* (2013.01); *H02M 7/5387* (2013.01); *H05K 1/0263* (2013.01); *H05K 1/181* (2013.01); *H05K 2201/10166* (2013.01); *H05K 2201/10363* (2013.01)

(58) Field of Classification Search
USPC ................ 310/64, 68 D, 71, 72, 216.056
See application file for complete search history.

(56) References Cited

FOREIGN PATENT DOCUMENTS

| | | | | |
|---|---|---|---|---|
| JP | 2010060241 A | * | 3/2010 | ............ F24F 13/20 |
| JP | 2010-161846 A | | 7/2010 | |
| JP | 2012-119618 A | | 6/2012 | |
| JP | 2013-038828 A | | 2/2013 | |
| JP | 2013-093364 A | | 5/2013 | |
| JP | 2013-118754 A | | 6/2013 | |
| WO | WO-2012147189 A1 | * | 11/2012 | ............ H02M 3/158 |

OTHER PUBLICATIONS

Extended EP Search Report dated Feb. 6, 2018 issued in corresponding EP patent application No. 16858485.2.
International Search Report dated Aug. 2, 2016 issued in corresponding international patent application No. PCT/JP2016/063291.
Official Notice dated Sep. 4, 2018 in the corresponding JP patent application No. 2018-514036 (and English translation).

* cited by examiner

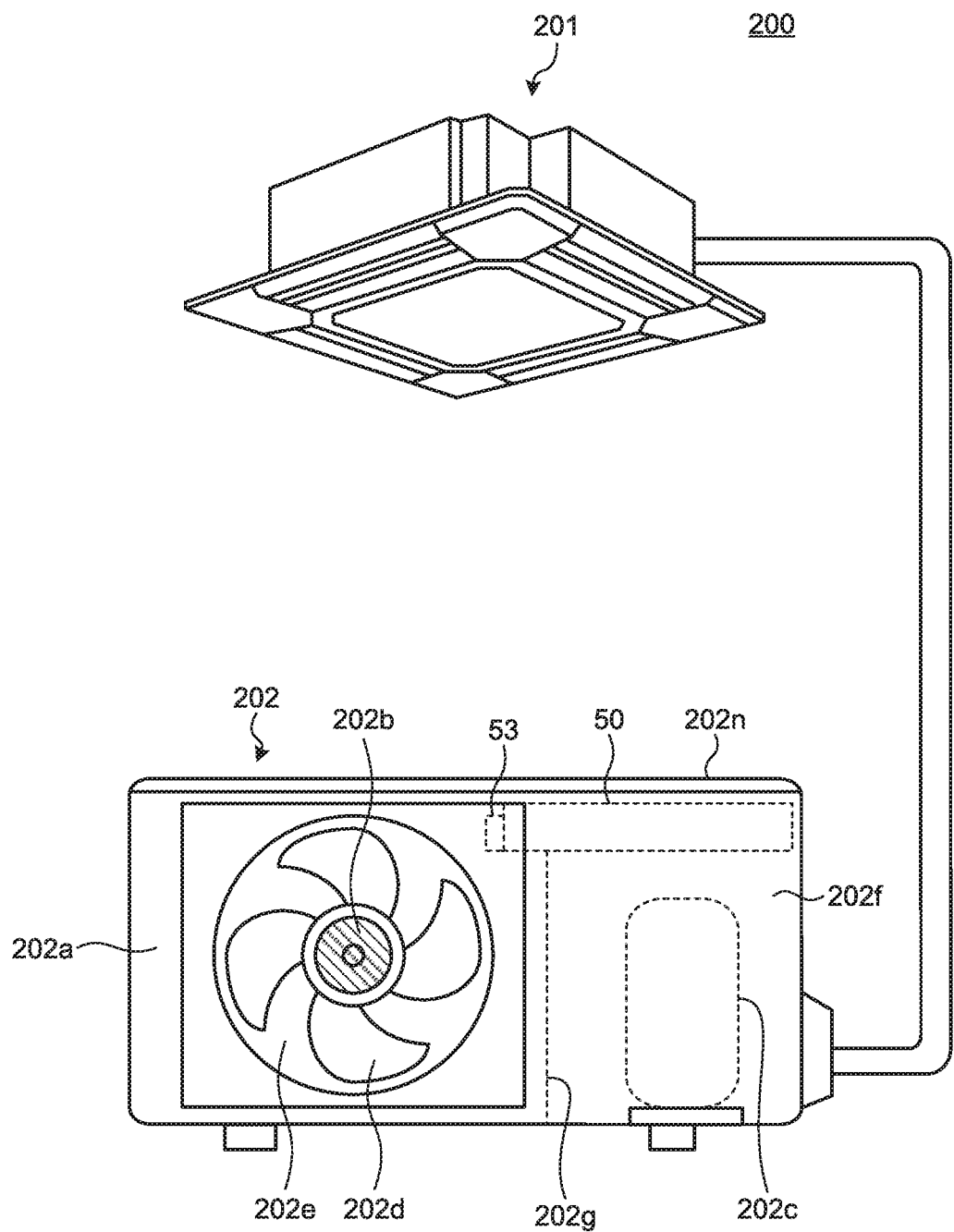

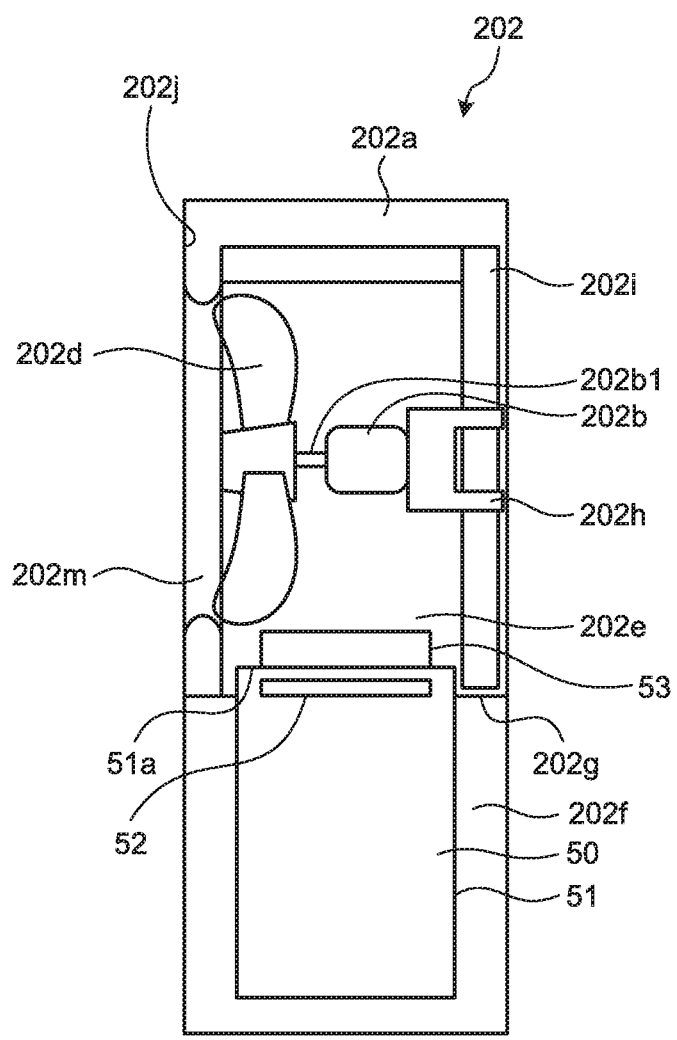

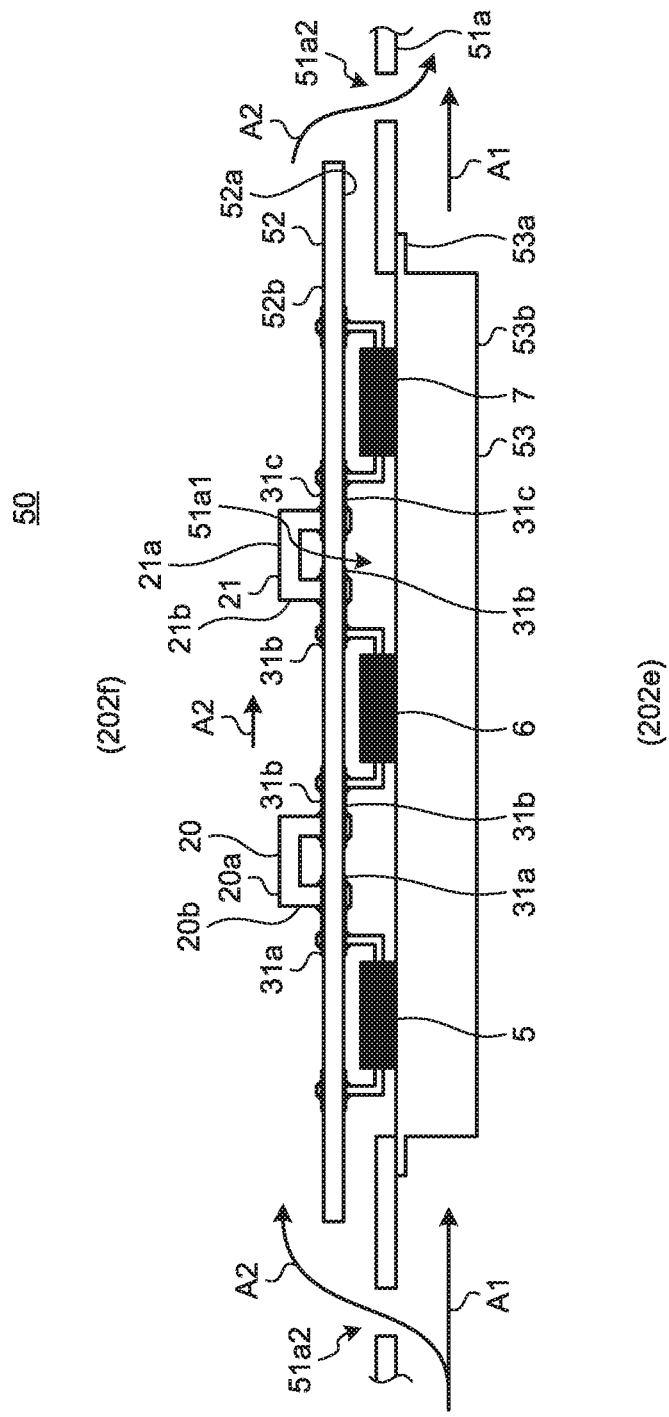

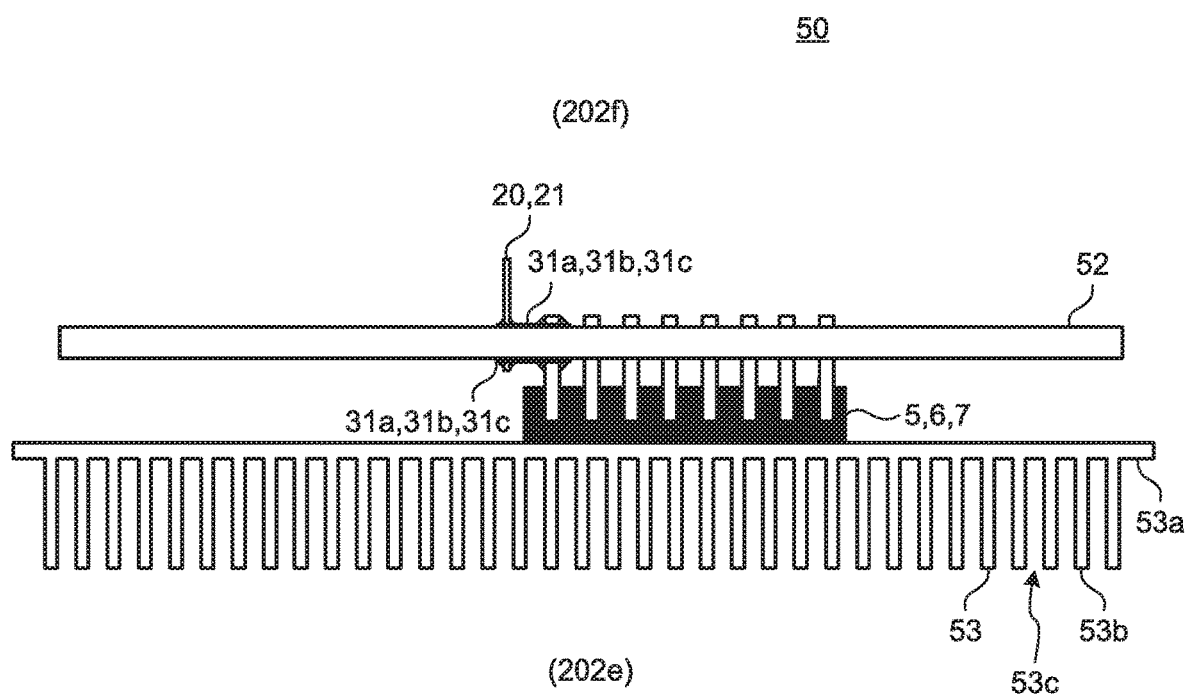

MOTOR DRIVING DEVICE AND AIR CONDITIONER

CROSS REFERENCE TO RELATED APPLICATION

This application is a U.S. national stage application of International Patent Application No. PCT/JP2016/063291 filed on Apr. 27, 2016, the disclosure of which is incorporated herein by reference.

TECHNICAL FIELD

The present invention relates to a motor driving device that converts direct-current power to alternating-current power and drives a motor, and an air conditioner.

BACKGROUND

A conventional motor driving device includes an inverter module, and a plurality of switching elements are arranged in the inverter module. When the switching elements are mounted as a chip, the yield of taking the chip out from a wafer is improved by making a chip area small. Further, in some cases, both cost reduction and increase in electric current for the motor driving device can be achieved at the same time by using a plurality of inverter modules connected in parallel. Patent Literature 1 discloses a technique of using a plurality of inverter modules to realize their parallel drive.

PATENT LITERATURE

Japanese Patent Application Laid-open No. 2010-161846

In the conventional technique described in Patent Literature 1, a plurality of inverter modules are arranged on a printed circuit board, and adjacent inverter modules are connected to one another by a wiring pattern on the circuit board. Therefore, in the conventional technique described in Patent Literature 1, the wiring impedance between the adjacent inverter modules becomes larger as compared with the wiring impedance on a circuit board having a single inverter module mounted thereon, and the amount of heat generation caused by the wiring impedance becomes larger. Because temperature increase in the motor driving device has an influence on the life of parts constituting the motor driving device, a busbar with a complicated shape is used in the conventional motor driving device represented by Patent Literature 1 in order to reduce the wiring impedance. However, the use of such a busbar increases the manufacturing cost for the motor driving device.

SUMMARY

The present invention has been achieved in view of the above circumstances, and an object of the present invention is to provide a motor driving device that can suppress increase in manufacturing cost while curbing the rise in temperature.

In order to solve the above-mentioned problems and achieve the object, the present invention provides a motor driving device that converts alternating-current power to direct-current power and drives a motor, the motor driving device comprising a printed circuit board having a first plate surface and a second plate surface, having a first inverter module and a second inverter module provided on the first plate surface, having a first power pattern provided on the second plate surface and connected to the first inverter module, having a second power pattern provided on the second plate surface and connected to the second inverter module, and having a first jumper portion to connect the first power pattern and the second power pattern, wherein a cross-sectional area of the first jumper portion is larger than a cross-sectional area of the first power pattern or the second power pattern.

The motor driving device of the present invention has an effect of making it possible to suppress the increase in manufacturing cost while curving the rise in temperature.

BRIEF DESCRIPTION OF DRAWINGS

FIG. 2 is a configuration illustration of an air conditioner according to the embodiment of the present invention.

FIG. 3 is an interior view of an outdoor unit illustrated in FIG. 2.

FIG. 4 is a partially enlarged view of an electric-component box shown in FIG. 3.

FIG. 5 is a side view of a printed circuit board and a heat sink illustrated in FIG. 4, as viewed from the right side of a paper sheet of FIG. 4.

DETAILED DESCRIPTION

Figure 1:
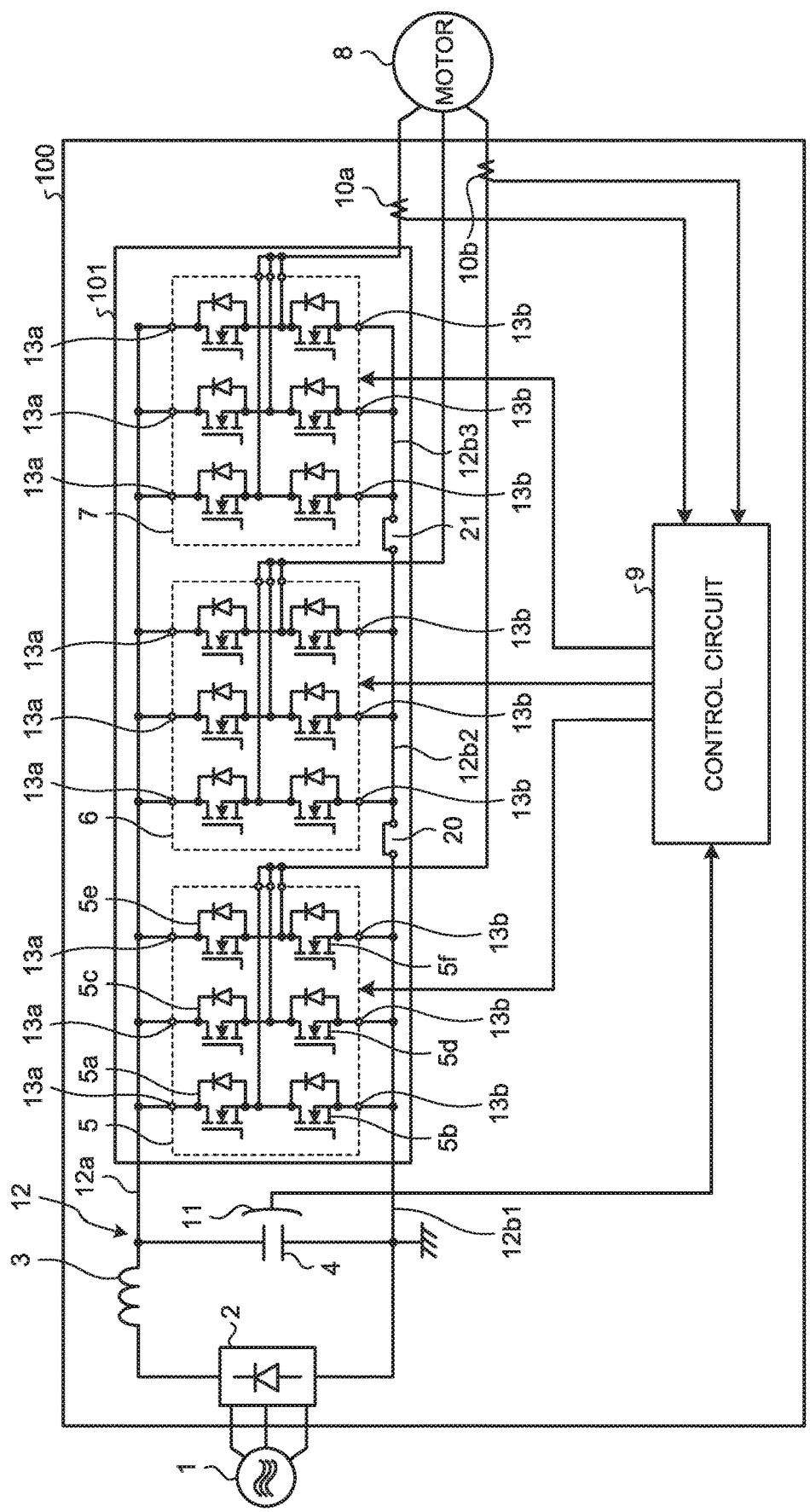
FIG. 1 is a configuration diagram of a motor driving device according to an embodiment of the present invention.

A motor driving device and an air conditioner according to an embodiment of the present invention are described below in detail with reference to the drawings. The present invention is not limited to the following embodiment.

Embodiment

FIG. 1 is a configuration diagram of a motor driving device 100 according to an embodiment of the present invention. The motor driving device 100 includes a rectifier 2 that rectifies an alternating-current voltage supplied from an alternating-current power supply 1, a reactor 3, a capacitor 4 that smooths the voltage rectified by the rectifier 2, a voltage detection unit 11 that detects a voltage across the capacitor 4, an inverter circuit 101 that converts the direct-current voltage smoothed by the capacitor 4 into an alternating-current voltage and drives a motor 8 that is a three-phase motor, a control circuit 9 that generates PWM (Pulse Width Modulation) signals for controlling the inverter circuit 101, and a plurality of current measuring units 10a and 10b that measure a motor current. A three-phase induction rotary electric machine can be exemplified as the motor 8.

The rectifier 2 and the inverter circuit 101 are connected to each other via direct-current bus lines 12. The rectifier 2 is a full-wave rectification circuit based on a diode-bridge. One end of the capacitor 4 is connected to a positive-side bus line 12a of the direct-current bus line 12, and the other end of the capacitor 4 is connected to a negative-side bus line 12b1 of the direct-current bus line 12. The current measuring units 10a and 10b are provided between the inverter circuit 101 and the motor 8.

The inverter circuit 101 includes an inverter module 5 that is a first inverter module corresponding to a U-phase, an inverter module 6 that is a second inverter module corresponding to a V-phase, and an inverter module 7 that is a third inverter module corresponding to a W-phase.

The inverter module 5 includes six switching elements 5a, 5b, 5c, 5d, 5e, and 5f. Specifically, the inverter module 5 includes the switching elements 5a and 5b connected to each other in series, the switching elements 5c and 5d connected to each other in series, and the switching elements 5e and 5f connected to each other in series. The switching elements 5a, 5c, and 5e constitute an upper arm, and the switching elements 5b, 5d, and 5f constitute a lower arm. The switching elements 5a, 5c, and 5e constituting the upper arm are connected to positive-side terminals 13a of the inverter module 5. The switching elements 5b, 5d, and 5f constituting the lower arm are connected to negative-side terminals 13b of the inverter module 5. The positive-side terminals 13a are connected to the positive-side bus line 12a, and the negative-side terminals 13b are connected to the negative-side bus line 12b1. A connecting point between the switching element 5a and the switching element 5b is connected to the motor 8. Similarly, a connecting point between the switching element 5c and the switching element 5d is connected to the motor 8, and a connecting point between the switching element 5e and the switching element 5f is connected to the motor 8.

Each of the inverter modules 6 and 7 is configured in the same manner as the inverter module 5. In FIG. 1, reference signs of a plurality of switching elements 5a to 5f included in each of the inverter modules 6 and 7 are omitted. The positive-side terminals 13a of the inverter module 6 are connected to the positive-side bus line 12a, and the negative-side terminals 13b of the inverter module 6 are connected to a negative-side bus line 12b2. The positive-side terminals 13a of the inverter module 7 are connected to the positive-side bus line 12a, and the negative-side terminals 13b of the inverter module 7 are connected to a negative-side bus line 12b3.

The positive-side bus line 12a is a positive-side power pattern on a circuit board (not illustrated) that constitutes the inverter circuit 101, and the negative-side bus lines 12b1, 12b2, and 12b3 are negative-side power patterns on the circuit board constituting the inverter circuit 101. The inverter module 5 and the inverter module 6 are placed adjacently to each other, and the inverter module 6 and the inverter module 7 are placed adjacently to each other. Further, the negative-side bus line 12b1 and the negative-side bus line 12b2 that are adjacent to each other are connected to each other by a jumper portion 20 that is a first jumper portion. The negative-side bus line 12b2 and the negative-side bus line 12b3 that are adjacent to each other are connected to each other by a jumper portion 21 that is a second jumper portion. Later description is given for details of configurations of the circuit board constituting the inverter circuit 101, the power patterns on the circuit board, and the jumper portions 20 and 21.

The control circuit 9 controls the inverter circuit 101 based on a voltage detected by the voltage detection unit 11 and motor currents measured by the current measuring units 10a and 10b. Specifically, the control circuit 9 generates PWM signals for controlling on/off states of the switching elements on a phase basis and on an arm basis, and outputs the PWM signals to the inverter circuit 101. The PWM signal is a pulsed signal having a value of High that sets the switching element in the on-state or a value of Low that sets the switching element in the off-state. In the inverter circuit 101, one arm for one phase is composed of three switching elements. Therefore, a pulse width is determined based on a current that flows when the three switching elements are in the on-state. The pulse width is equal to a time length during which the switching elements continue to be in the on-state. The control circuit 9 generates the PWM signals while regarding the three switching elements for the upper arm or the lower arm included in each of the inverter modules 5, 6, and 7 as one switching element with a large current capacity.

As the switching elements 5a to 5f, there can be exemplified semiconductor switches such as an IPM (Intelligent Power Module), an IGBT (Insulated Gate Bipolar Transistor), a MOSFET (Metal Oxide Semiconductor Field Effect Transistor), an IGCT (Insulated Gate Controlled Thyristor), or an FET (Field Effect Transistor).

As a material for the switching elements 5a to 5f, gallium nitride (GaN), silicon carbide (SiC), or diamond, which is referred to as a wide-bandgap semiconductor can be exemplified. By using a wide-bandgap semiconductor material, voltage endurance becomes higher and allowable current density is increased, and therefore downsizing of a module can be realized. Because the wide-bandgap semiconductor also has high heat resistance, downsizing of a radiation fin in a heat radiating unit can be also realized.

An operation of the motor driving device 100 is described as follows. An alternating-current voltage outputted from the alternating-current power supply 1 is applied to the rectifier 2 where the alternating-current voltage is converted to a direct-current voltage. The direct-current voltage obtained by the conversion is smoothed by the capacitor 4, and then applied to the inverter circuit 101 by which the direct-current voltage is converted to an alternating-current voltage with a variable frequency. The resultant alternating-current voltage is then supplied to the motor 8.

A general inverter that drives a three-phase motor is described here as a comparative example. Generally, in a case of driving a three-phase motor using an inverter, the inverter is provided with a pair of switching elements for each phase, which is composed of one switching element of an upper arm and one switching element of a lower arm that are connected in series. Therefore, the inverter of the comparative example includes a total of three pairs, that is, six switching elements for three phases. Meanwhile, in a case where the switching elements are mounted as a chip, the yield of taking the chip out from a wafer can be improved as a chip area is made smaller. Particularly, in a case of using SiC as the material for the switching elements, the wafer is more expensive as compared with a case of using Si as the material for the switching elements, and therefore it is desirable to make the chip area smaller in order to reduce the price of the inverter. In a case where a current capacity can be small, such as a case where the inverter is used for an air conditioner for home use, the price can be reduced by using an inverter module that controls three phases with six switching elements having a small chip area.

However, as the chip area is made smaller, the current capacity becomes smaller. For this reason, it is difficult to realize both reduction of the price and adaptation to a large current at the same time in the inverter module of the comparative example, that is, the inverter module that drives the three-phase motor with six switching elements. On the other hand, in the present embodiment, it is possible to realize both reduction of the price and adaptation to a large current at the same time by using switching elements having a small current capacity in parallel. Further, a basic part can be communalized between one inverter module for three phases that is constituted by six switching elements described in the comparative example, and the inverter modules 5, 6, and 7 according to the present embodiment. In the inverter circuit 101, the inverter module for three phases constituted by six switching elements can be used as the inverter modules 5, 6, and 7 without any change, or can be used as the inverter modules 5, 6, and 7 with simple changes made to the inverter module for three phases. In other words, one inverter module for three phases and the inverter modules 5, 6, and 7 illustrated in FIG. 1 can be manufactured as the same or similar modules. Therefore, the inverter modules 5, 6, and 7 for a large current capacity can be manufactured inexpensively. As an example, one module for three phases constituted by six switching elements can be used for an air conditioner for home use, and the inverter circuit 101 including three modules as illustrated in FIG. 1 can be used for an air conditioner for business use.

The motor driving device 100 according to the present embodiment can be mounted in an apparatus, such as an air conditioner, a freezer, a washing and drying machine, a refrigerator, a dehumidifier, a heat-pump type water heater, a showcase, a vacuum cleaner, a fan motor, a ventilator, a hand dryer, or an electromagnetic induction heating cooker, and can be used as a device that drives a motor incorporated in the apparatus.

Description is given below for an example in which the motor driving device 100 is mounted in an outdoor unit of an air conditioner.

FIG. 2 is a configuration illustration of an air conditioner 200 according to the present embodiment of the present invention. FIG. 3 is an interior view of an outdoor unit 202 illustrated in FIG. 2. In FIG. 3, an internal configuration of the outdoor unit 202 viewed from a top plate 202n of the outdoor unit 202 is illustrated. FIG. 4 is a partially enlarged view of an electric-component box 50 illustrated in FIG. 3. FIG. 4 illustrates, in an enlarged manner, a portion of the electric-component box 50 viewed from the top plate 202n of the outdoor unit 202, on which a printed circuit board 52 and a heat sink 53 are provided. A lower side of a paper sheet of FIG. 4 corresponds to a side of an air-blowing chamber 202e, an upper side of the paper sheet corresponds to a side of a machine chamber 202f, a left side of the paper sheet corresponds to a side of a heat exchanger 202i, and a right side of the paper sheet corresponds to a side of an air-blowing fan 202d or a side of an air outlet 202m. FIG. 5 is a side view of the printed circuit board 52 and the heat sink 53 illustrated in FIG. 4, as viewed from a right side of the paper sheet of FIG. 4.

The air conditioner 200 is an example of an apparatus including the motor driving device 100 illustrated in FIG. 1. The air conditioner 200 includes an indoor unit 201 and the outdoor unit 202. The outdoor unit 202 includes a casing 202a, the heat exchanger 202i, a fan fixture 202h, an electric motor 202b, the air-blowing fan 202d, the machine chamber 202f, a partition plate 202g, a compressor 202c, and the electric-component box 50.

The heat exchanger 202i is provided inside the casing 202a. The fan fixture 202h is provided at a center of a back of the heat exchanger 202i. The air-blowing chamber 202e is provided between the air outlet 202m on a side of a front surface 202j of the casing 202a and the heat exchanger 202i. The electric motor 202b that is a driving source of the air-blowing fan 202d is placed in the air-blowing chamber 202e of the casing 202a using the fan fixture 202h. The air-blowing fan 202d is attached to a rotation shaft 202b1 of the electric motor 202b. The compressor 202c is placed in the inside of the machine chamber 202f. The machine chamber 202f has a rainproof structure in which the chamber 202f is separated from the air-blowing chamber 202e by the partition plate 202g.

As illustrated in FIG. 2, the electric-component box 50 is placed on the machine chamber 202f side while being placed between the top plate 202n and the compressor 202c. As illustrated in FIG. 3, the electric-component box 50 includes a rectangular housing 51 formed by processing metal that is an example of a noncombustible material, the printed circuit board 52 provided inside the housing 51, and the heat sink 53. The printed circuit board 52 is provided with parts constituting the motor driving device 100 illustrated in FIG. 1.

In FIG. 3, the printed circuit board 52 and the heat sink 53 are placed on a side piece 51a of the housing 51 of the electric-component box 50, the side piece 51a being on the air-blowing chamber 202e side. The printed circuit board 52 is provided inside the housing 51, and the heat sink 53 is provided outside the housing 51.

As illustrated in FIGS. 4 and 5, the heat sink 53 includes a fin base 53a that serves as an attachment surface for the inverter modules 5, 6, and 7, and a plurality of fins 53b. The fins 53b are provided on the air-blowing chamber 202e side of the fin base 53a, and are arranged to be cooled by a wind flowing to the air-blowing chamber 202e. That is, the heat sink 53 is placed in such a manner that a wind flowing to the air-blowing chamber 202e flows to gaps 53c between adjacent fins 53b. More specifically, the fins 53b are fixed on the fin base 53a, and a number of fins 53b are arranged in an orientation in which a wind A1 flowing in the air-blowing chamber 202e that is an air path can be taken in. Aluminum can be exemplified as the material for the fins 53b and the fin base 53a.

The side piece 51a of the housing 51 has one opening 51a1 and two openings 51a2 formed therein. In FIG. 4, the opening 51a1 and the openings 51a2 are arranged in the order of the opening 51a2, the opening 51a1, and the opening 51a2 from the left side of the paper sheet. The area of the opening 51a1 is larger than the area of each of the two openings 51a2. The heat sink 53 is fixed on the side piece 51a on the air-blowing chamber 202e side to close the opening 51a1. The printed circuit board 52 is provided on the machine chamber 202f side of the side piece 51a.

The printed circuit board 52 includes a first plate surface 52a on the air-blowing chamber 202e side, a second plate surface 52b on the machine chamber 202f side, the inverter modules 5, 6, and 7 provided on the first plate surface 52a, a first power pattern 31a provided on the second plate surface 52b and connected to the inverter module 5, a second power pattern 31b provided on the second plate surface 52b and connected to the inverter module 6, and a third power pattern 31c provided on the second plate surface 52b and connected to the inverter module 7.

The first power pattern 31a is a copper foil pattern corresponding to the negative-side bus line 12b1 illustrated in FIG. 1. The second power pattern 31b is a copper foil pattern corresponding to the negative-side bus line 12b2 illustrated in FIG. 1. The third power pattern 31c is a copper foil pattern corresponding to the negative-side bus line 12b3 illustrated in FIG. 1.

The printed circuit board 52 also includes the jumper portion 20 that is provided on the second plate surface 52b and connects the first power pattern 31a and the second power pattern 31b, and the jumper portion 21 that is provided on the second plate surface 52b and connects the second power pattern 31b and the third power pattern 31c.

Although not illustrated in FIG. 4, it is assumed that a power pattern corresponding to the positive-side bus line 12a illustrated in FIG. 1, a diode-bridge circuit constituting the rectifier 2, the reactor 3, and the capacitor 4 are provided on the printed circuit board 52. These components are connected to the copper foil patterns on the printed circuit pattern 52 by soldering.

The printed circuit board 52 is provided with the first plate surface 52a facing the heat sink 53. Each of the inverter modules 5, 6, and 7 provided on the first plate surface 52a is in contact with the heat sink 53.

The inverter modules 5, 6, and 7 are arranged in this order from the heat exchanger 202i (not illustrated) on the left side of the paper sheet toward the air-blowing fan 202d (not illustrated) on the right side of the paper sheet. That is, the inverter modules 5, 6, and 7 are arranged in order in a flowing direction of the wind A1 flowing in the air-blowing chamber 202e.

The jumper portions 20 and 21 are electrically conductive members with a squared U-shape, and the same material as that of the copper foil pattern on the printed circuit board 52 can be exemplified as the material for the jumper portions 20 and 21. The shape of the jumper portions 20 and 21 is not limited to a squared U-shape, and may be a U-shape, a C-shape, or a bending shape equivalent thereto. The jumper portion 20 has a straight base portion 20a and a pair of terminal portions 20b bent at right angles from both ends of the base portion 20a. The pair of terminal portions 20b is inserted into through holes (not illustrated) formed in the printed circuit board 52, and soldered to connect to the first power pattern 31a and the second power pattern 31b. The jumper portion 21 has a straight base portion 21a and a pair of terminal portions 21b bent at right angles from both ends of the base portion 21a. The pair of terminal portions 21b is inserted into through holes (not illustrated) formed in the printed circuit board 52 and soldered to connect to the second power pattern 31b and the third power pattern 31c.

A cross-sectional area of each of the jumper portions 20 and 21 is larger than a cross-sectional area of the first power pattern 31a, the second power pattern 31b, or the third power pattern 31c. In the present embodiment, the cross-sectional area of each of the jumper portions 20 and 21 is set to ten or more times the copper foil pattern on the printed circuit board 52. Due to this setting, an impedance between the adjacent inverter modules can be significantly reduced. Further, in the present embodiment, a height of the jumper portions 20 and 21 is set to 10 millimeters or higher in view of heat radiation performance.

An operation of the outdoor unit 202 is described. The control circuit 9 having received an instruction for a cooling operation or a heating operation drives the inverter circuit 101, so that the compressor 202c and the air-blowing fan 202d are driven. When the compressor 202c is driven, a refrigerant circulates in the heat exchanger 202i, and heat exchange is conducted between air around the heat exchanger 202i and the refrigerant. Also, rotation of the air-blowing fan 202d causes generation of negative pressure, so that air on a side piece and a back piece of the outdoor unit 202 is taken into the air-blowing chamber 202e. The wind A1 generated at this time flows to a back portion and a side surface portion of the heat exchanger 202i to promote heat exchange in the heat exchanger 202i.

In addition, a portion of the wind A1 generated by rotation of the air-blowing fan 202d enters into the electric-component box 50 from the opening 51a2 that is the first opening on the left side of the paper sheet of FIG. 4. A wind A2 having entered into the electric-component box 50 flows around the jumper portions 20 and 21 provided on the second plate surface 52b of the printed circuit board 52, and is discharged to outside of the electric-component box 50 from the opening 51a2 that is the second opening on the right side of the paper sheet of FIG. 4.

It is not suitable to actively expose the printed circuit board 52 to the wind A2 because dust or the like is caused to be attached thereto. However, when the air-blowing chamber 202e that is an air path for exposing the heat sink 53 to the wind A1 and a space in the electric-component box 50 that is an air path for exposing the jumper portions 20 and 21 to the wind A2 are separated from each other, it is possible to cause the wind A2 to flow towards the jumper portions 20 and 21 in a form such that the wind A2 is drawn by a strong wind A1 flowing towards the heat sink. That is, by providing two openings 51a2 in the air-blowing chamber 202e of the electric-component box 50, the internal pressure of the electric-component box 50 becomes lower than the external pressure of the electric-component box 50 when the wind A1 flows in the air-blowing chamber 202e, and the wind A2 flowing in the electric-component box 50 is drawn into the strong wind A1 flowing towards the heat sink 53.

By providing the jumper portions 20 and 21, the motor driving device 100 according to the present embodiment can efficiently radiate heat generated in a pattern wiring on the printed circuit board 52 and heat generated in a soldered portion via the jumper portions 20 and 21, so that temperature increase can be suppressed. Therefore, a heat cycle caused by temperature increase can be constricted, and long-term reliability of the printed circuit board 52 can be improved. Further, because the motor driving device 100 according to the present embodiment has a configuration that allows the jumper portions 20 and 21 to be exposed to the wind A2, the temperature increase caused by the heat generated in the pattern wiring on the printed circuit board 52 can be further constricted, and the motor driving device 100 can be also applied to the inverter circuit 101 with a large current.

Although the present embodiment has given description for an example in which the jumper portions 20 and 21 are applied to the negative-side bus lines 12b1, 12b2, and 12b3, the jumper portions 20 and 21 may be also applied to the positive-side bus line 12a. In this case, the positive-side bus line 12a is configured to be divided into a plurality of bus lines similarly to the negative-side bus lines 12b1, 12b2, and 12b3, and the jumper portions 20 and 21 are interposed between adjacent positive-side bus lines. Further, the jumper portions 20 and 21 may be also applied to the negative-side bus lines 12b1, 12b2, and 12b3, and the positive-side bus line 12a.

By applying the jumper portions 20 and 21 to the positive-side bus line 12a, it is possible to achieve effects identical to those in the case where the jumper portions 20 and 21 are applied to the negative-side bus lines 12b1, 12b2, and 12b3. On the other side, in the case where the jumper portions 20 and 21 are applied to the negative-side bus lines 12b1, 12b2, and 12b3, the impedance of the negative-side bus line between the inverter modules can be widely reduced, and therefore the ground (GND) of the inverter circuit 101 can be made stable. Particularly, in a case where the plural inverter modules 5, 6, and 7 are driven similarly to the inverter circuit 101 according to the present embodiment, a plurality of grounds (GNDs) can be made stable, and therefore it is possible to commonly use a direct-current stable power supply for driving the switching elements. Furthermore, it is possible to realize an even more inexpensive and highly reliable motor driving device 100.

Further, although the present embodiment has given description for an example in which the number of the switching elements connected in parallel to constitute one arm is three, the number in parallelism may be two or more. However, most of general-purpose inverter modules for driving a motor is for three phases, and it is possible to easily configure an inverter circuit for a three-phase motor, which includes three switching elements connected in parallel, using general-purpose products, by connecting three of the modules in parallel if the number in parallelism is three. Therefore, if so, there is a certain merit in terms of cost and availability.

Although the present embodiment has given description for an example of using the heat sink 53, the impedance between the inverter modules can be reduced even in a configuration where the heat sink 53 is omitted. However, when the motor driving device 100 is configured to include the heat sink 53, the heat sink 53 is placed in such a manner that a wind flowing in an air path of an apparatus including the motor driving device 100 flows to the gaps 53*c* between adjacent fins 53*b*, and the jumper portion 20 and the jumper portion 21 are arranged along a direction in which each of the plural fins 53*b* extends, whereby the jumper portion 20 and the jumper portion 21 can be effectively cooled by virtue of the wind A2 flowing in the same direction as the wind A1 flowing in gaps of the heat sink 53. Therefore, with this configuration, the heat generated on the printed circuit board 52 can be dissipated more efficiently.

Although an example in which the two openings 51*a*2 are provided in the housing 51 of the electric-component box 50 has been described in the present embodiment, it is possible to efficiently dissipate the heat generated on the printed circuit board 52 by the jumper portion 20 and the jumper portion 21 even without providing the openings 51*a*2. However, when a first opening through which a portion of a wind flowing in the air path of the apparatus enters and a second opening through which a wind having entered into the electric-component box is discharged are provided in the electric-component box, and the jumper portion 20 or the jumper portion 21 is placed between the first opening and the second opening, the jumper portion 20 or the jumper portion 21 can be effectively cooled by the wind A2 flowing in the same direction as the wind A1 flowing in the gaps of the heat sink 53. Therefore, as compared with a case where the first opening and the second opening are not provided, it is possible to more efficiently dissipate the heat generated on the printed circuit board 52. Particularly, by disposing both the jumper portion 20 and the jumper portion 21 between the first opening and the second opening, it is possible to radiate the heat generated on the printed circuit board 52 more efficiently, as compared with a case where the jumper portion 20 or the jumper portion 21 is disposed between the first opening and the second opening.

As described above, according to the motor driving device 100 of the present embodiment, it is possible to efficiently radiate heat generated on the printed circuit board 52 by using a wind leaking from the side of the heat sink 53, that is, the wind A2 illustrated in FIG. 4. Due to this configuration, the impedance between the inverter modules can be reduced by an inexpensive configuration, and the heat of the printed circuit board 52 can be efficiently radiated, so that the product reliability can be improved. Further, by mounting the motor driving device 100 according to the present embodiment on the air conditioner 200, it is possible to obtain a highly reliable air conditioner 200 with an inexpensive configuration.

The configuration described in the above embodiment is just an example of the contents of the present invention, and the configuration can be combined with other publicly known techniques and can be partially omitted or modified without departing from the scope of the present invention.

The invention claimed is:

1. A motor driving device that converts alternating-current power to direct-current power and drives a motor, the motor driving device comprising:
    a contiguous printed circuit board having a first plate surface and a second plate surface;
    a first inverter module and a second inverter module provided on the first plate surface;
    a first contiguous power pattern provided on the second plate surface and electrically connected to the first inverter module;
    a second contiguous power pattern provided on the second plate surface and electrically connected to the second inverter module; and
    a first jumper portion to electrically connect the first power pattern and the second power pattern,
    wherein
        a cross-sectional area of the first jumper portion is larger than a cross-sectional area of the first power pattern or the second power pattern.

2. The motor driving device according to claim 1, wherein the printed circuit board has a third inverter module provided on the first plate surface, a third power pattern provided on the second plate surface and connected to the third inverter module, a second jumper portion to connect the second power pattern and the third power pattern, and a heat sink provided in contact with the first inverter module, the second inverter module, and the third inverter module,
    the heat sink has a fin base provided in contact with the first inverter module, the second inverter module, and the third inverter module, and a plurality of fins provided on the fin base, and is placed in such a manner that a wind flowing in an air path of an apparatus including the motor driving device flows to a gap between adjacent ones of the fins, and
    the first jumper portion and the second jumper portion are arranged along a direction in which each of the fins extends.

3. The motor driving device according to claim 1, comprising an electric-component box having the printed circuit board incorporated therein, wherein
    the electric-component box has a first opening through which a portion of a wind flowing in an air path of an apparatus including the motor driving device enters, and a second opening through which air having entered into the electric-component box is discharged, and
    the first jumper portion is disposed between the first opening and the second opening.

4. The motor driving device according to claim 2, comprising an electric-component box having the printed circuit board incorporated therein, wherein
    the electric-component box has a first opening through which a portion of a wind flowing in an air path of an apparatus including the motor driving device enters, and a second opening through which air having entered into the electric-component box is discharged, and
    the first jumper portion and the second jumper portion are arranged between the first opening and the second opening.

5. The motor driving device according to claim 1, wherein a switching element incorporated in the first inverter module is configured by using a wide-bandgap semiconductor.

6. An air conditioner comprising the motor driving device according to claim 1.

7. The motor driving device according to claim 2, comprising an electric-component box having the printed circuit board incorporated therein, wherein
    the electric-component box has a first opening through which a portion of a wind flowing in an air path of an apparatus including the motor driving device enters, and a second opening through which air having entered into the electric-component box is discharged, and the first jumper portion is disposed between the first opening and the second opening.

8. The motor driving device according to claim 2, wherein a switching element incorporated in the first inverter module is configured by using a wide-bandgap semiconductor.

9. The motor driving device according to claim 3, wherein a switching element incorporated in the first inverter module is configured by using a wide-bandgap semiconductor.

10. The motor driving device according to claim 7, wherein a switching element incorporated in the first inverter module is configured by using a wide-bandgap semiconductor.

11. The motor driving device according to claim 4, wherein a switching element incorporated in the first inverter module is configured by using a wide-bandgap semiconductor.

12. The air conditioner according to claim 6, wherein
the printed circuit board has a third inverter module provided on the first plate surface, a third power pattern provided on the second plate surface and connected to the third inverter module, a second jumper portion to connect the second power pattern and the third power pattern, and a heat sink provided in contact with the first inverter module, the second inverter module, and the third inverter module,
the heat sink has a fin base provided in contact with the first inverter module, the second inverter module, and the third inverter module, and a plurality of fins provided on the fin base, and is placed in such a manner that a wind flowing in an air path of an apparatus including the motor driving device flows to a gap between adjacent ones of the fins, and
the first jumper portion and the second jumper portion are arranged along a direction in which each of the fins extends.

13. The air conditioner according to claim 6, the motor driving device comprising an electric-component box having the printed circuit board incorporated therein, wherein
the electric-component box has a first opening through which a portion of a wind flowing in an air path of an apparatus including the motor driving device enters, and a second opening through which air having entered into the electric-component box is discharged, and
the first jumper portion is disposed between the first opening and the second opening.

14. The air conditioner according to claim 12, the motor driving device comprising an electric-component box having the printed circuit board incorporated therein, wherein
the electric-component box has a first opening through which a portion of a wind flowing in an air path of an apparatus including the motor driving device enters, and a second opening through which air having entered into the electric-component box is discharged, and
the first jumper portion is disposed between the first opening and the second opening.

15. The air conditioner according to claim 12, the motor driving device comprising an electric-component box having the printed circuit board incorporated therein, wherein
the electric-component box has a first opening through which a portion of a wind flowing in an air path of an apparatus including the motor driving device enters, and a second opening through which air having entered into the electric-component box is discharged, and
the first jumper portion and the second jumper portion are arranged between the first opening and the second opening.

16. The air conditioner according to claim 6, wherein a switching element incorporated in the first inverter module is configured by using a wide-bandgap semiconductor.

17. The air conditioner according to claim 12, wherein a switching element incorporated in the first inverter module is configured by using a wide-bandgap semiconductor.

18. The air conditioner according to claim 13, wherein a switching element incorporated in the first inverter module is configured by using a wide-bandgap semiconductor.

19. The air conditioner according to claim 14, wherein a switching element incorporated in the first inverter module is configured by using a wide-bandgap semiconductor.

20. The air conditioner according to claim 15, wherein a switching element incorporated in the first inverter module is configured by using a wide-bandgap semiconductor.

* * * * *